United States Patent
Lee

(10) Patent No.: US 6,600,650 B1
(45) Date of Patent: Jul. 29, 2003

(54) FASTENING DEVICE OF CPU HEAT SINK

(76) Inventor: Cheng-Ping Lee, No. 17, Jian San Rd., Junghe City, Taipei Hsien (TW)

( * ) Notice: Subject to any disclaimer, the term of this patent is extended or adjusted under 35 U.S.C. 154(b) by 16 days.

(21) Appl. No.: 10/166,257

(22) Filed: Jun. 11, 2002

(51) Int. Cl.[7] ................................................. H05K 7/20
(52) U.S. Cl. ....................... 361/697; 361/709; 361/801; 257/718; 24/457; 248/510
(58) Field of Search ................................. 361/694–697, 361/690, 709, 801, 807–810, 715; 165/121, 122, 126; 257/718, 719, 726; 24/295, 296, 457, 458; 248/510

(56) References Cited

U.S. PATENT DOCUMENTS

| | | | |
|---|---|---|---|
| 5,299,632 A | * | 4/1994 | Lee ............................ 165/80.3 |
| 5,495,392 A | * | 2/1996 | Shen .......................... 361/697 |
| 5,701,951 A | * | 12/1997 | Jean ........................... 165/121 |
| 6,160,704 A | * | 12/2000 | Rusate ........................ 361/697 |
| 6,487,079 B2 | * | 11/2002 | Katsui ......................... 361/704 |

* cited by examiner

Primary Examiner—Jayprakash N Gandhi

(57) ABSTRACT

A fastening device of the CPU heat sink comprising a heat sink with a base contacting the top of a CPU, a plurality numbers of heat dissipating plates on top of the base, a hollow space formed on top of heat dissipating plates, a fan located in and fixed on the hollow space, two identical fasteners fasten the fan on said hollow space, a fixing part on both top ends of the fasteners that corresponds to a fixing hole of said fan, at least one hook on bottom of the fasteners that corresponds to a fastening hole of the fan heat dissipating plate, an elastic arm is between and ties said fixing part and said hook together. The device is to reduce the material cost, and simplify the manufacturing process to fasten the fan onto the heat dissipating plate without any tool to reduce the manufacturing cost.

1 Claim, 4 Drawing Sheets

FASTENING DEVICE OF CPU HEAT SINK

BACKGROUND OF THE INVENTION

I. Field of the Invention

This invention relates generally to a fastening device of the CPU heat sink and, more specifically, to a fastening device of the CPU heat sink that to reduce the material cost, and simplify the manufacturing process to fasten the fan onto the heat dissipating plate without any tool to reduce the manufacturing cost.

II. Description of the Prior Art

Heretofore, it is known a CPU heat sink as shown in FIG. 1, the heat sink 1 consists of: a base 10 with a plurality numbers of heat dissipating plate 20, the heat dissipating plate 20 is made of a long thin metal sheet folded continuously to form a square wave shape heat dissipating area with top and bottom in "U" shape. A fan 30 is fixed on top center of the heat dissipating area. The contact area 11 of the base 10 contacts directly with CPU 40 on mainboard, the heat dissipating plate 20 dissipates heat generated by the CPU 40, the fan 30 blows air that further conducts heat out of the mainboard.

Since on top of the heat dissipating plate 20 is very difficult to have screw holes, therefore the way to have the fan 30 fixed on the heat dissipating plate 20 of the known heat sink 1, as shown in FIG. 1, is to have a frame 50 on top or surround the heat dissipating plate 20, then open a big airflow hole 51, and have screw hole 52 corresponding to fixing hole 31 of the fan 30 to have screws 32 fix fan of top of the frame 50. The frame adds extra cost and extra labor to have those screws to fix the fan.

SUMMARY OF THE INVENTION

It is therefore a primary object of the invention to provide a fastening device of the CPU heat sink to reduce material cost, and simplify the manufacturing process to fasten the fan onto the heat dissipating plate without any tool to reduce the manufacturing cost.

In order to achieve the objective set forth, a fastening device of the CPU heat sink in accordance with the present invention comprises two identical fasteners, the side view of the fastener is in 90°, the fastener is in long rectangle shape, a fixing part is on both top ends of the fastener that corresponds to the fixing hole of the fan; at least one hook is on bottom of the fastener that corresponds to the fastening hole of the fan heat dissipating plate; the fixing part and the hook are tied together with a elastic arm. The fixing part of the fastener is placed into the fixing hole of the fan first, then the hook of the fastener is pressed into the fastening hole of the fan heat dissipating plate without any tool, a elastic arm is between and ties the top fixing part and the bottom hook, the fan is fixed firmly on top of the heat dissipating plate by the elastic arm.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
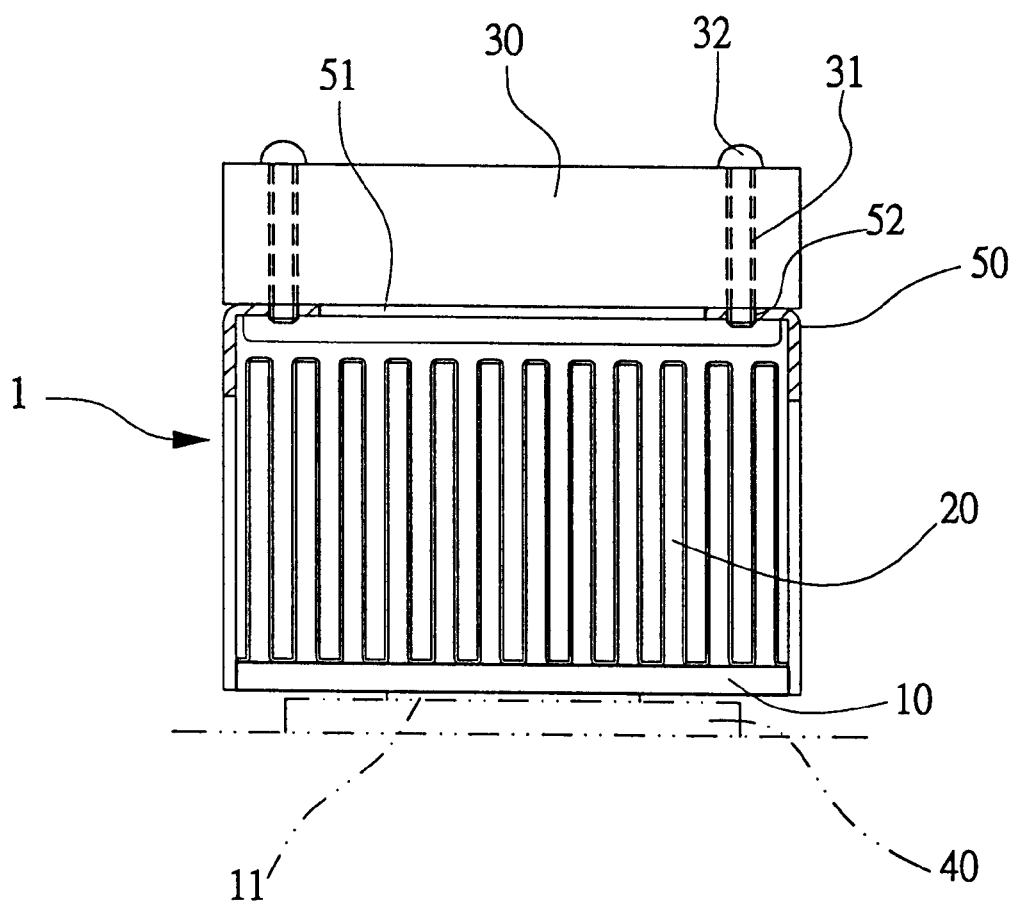
FIG. 1 is a cross-sectional view of the prior art.
Figure 2:
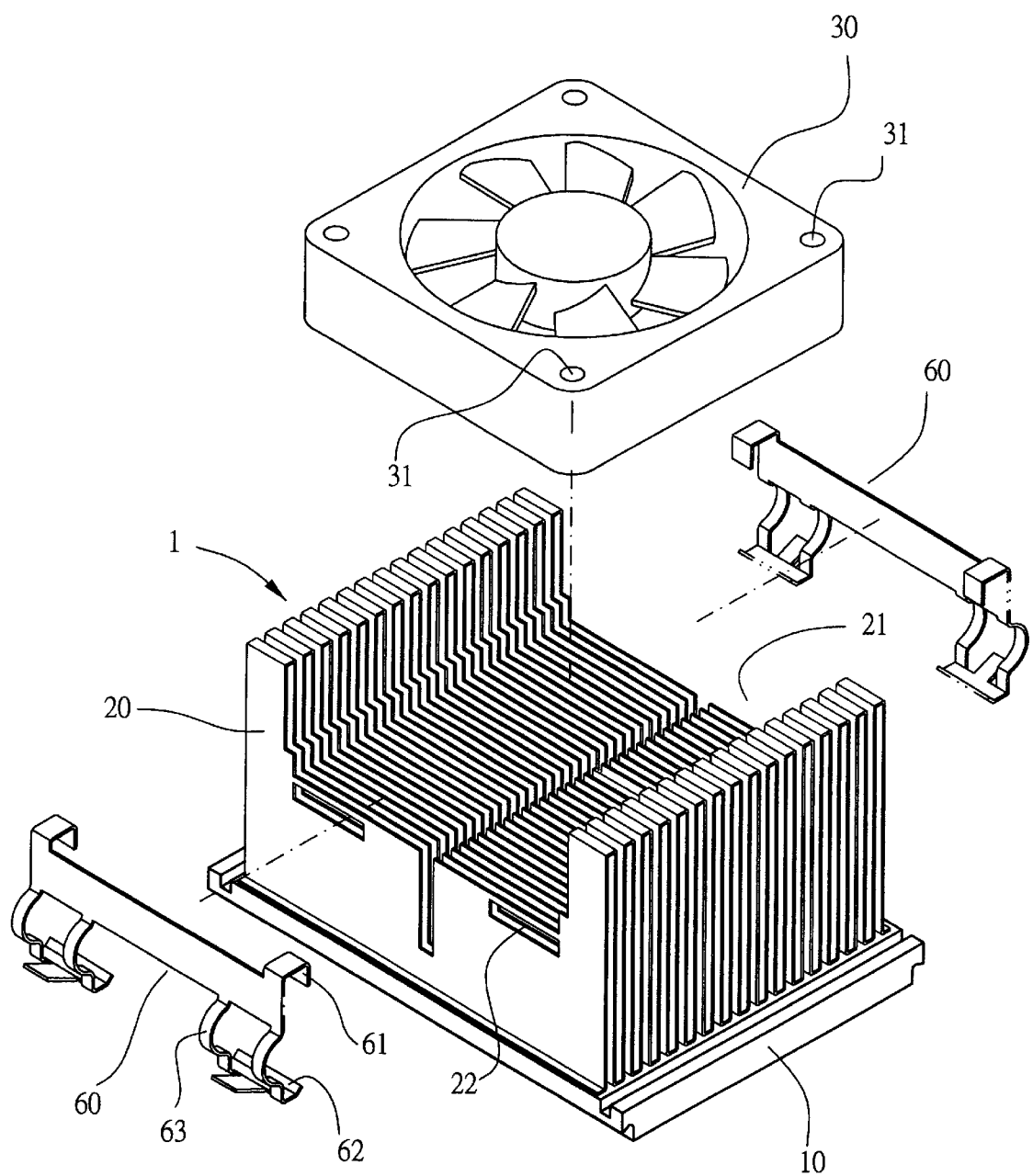
FIG. 2 is an explosive view of the present invention.
Figure 3:
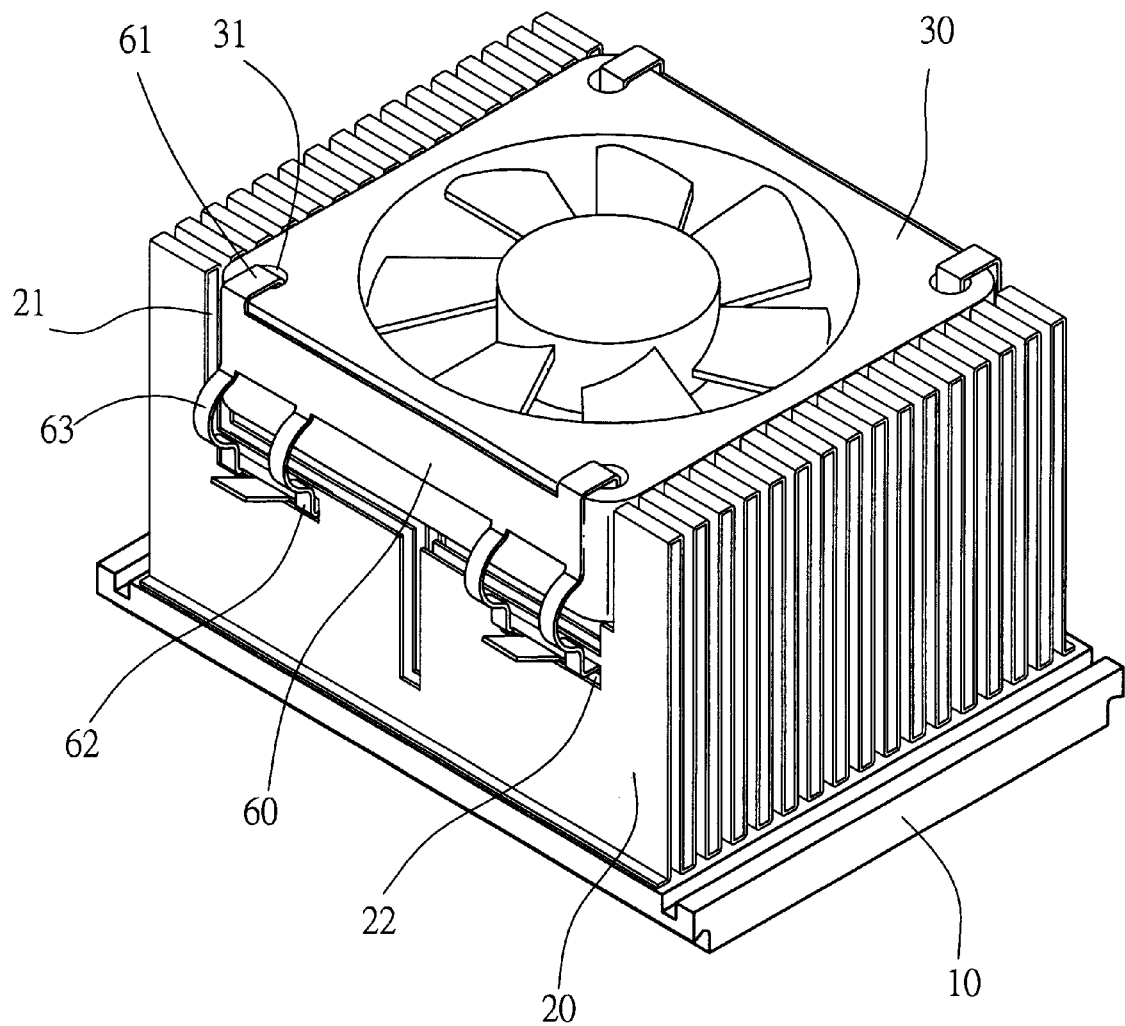
FIG. 3 is a perspective view of the present invention.

Referring to FIG. 2 and FIG. 3, the present invention is composed of a heat sink 1 which contacts the top of a CPU with a base 10, a plurality numbers of heat dissipating plate 20 are on top of the base, a hollow space 21 is formed on top of the heat dissipating plate 20, a fan 30 is in and fixed on the hollow space 21; the fan 30 is fixed with two identical fastener 60. The side view of the fastener 60 is in 90°, the fastener 60 is in long rectangle shape, a fixing part 61 is on both top ends of the fastener 60 that corresponds to the fixing hole 31 of the fan 30; at least one hook 62 is on bottom of the fastener 60 that corresponds to the fastening hole 22 of the fan heat dissipating plate 20; the fixing part 61 and the hook 62 are tied together with a elastic arm 63.

Figure 4:
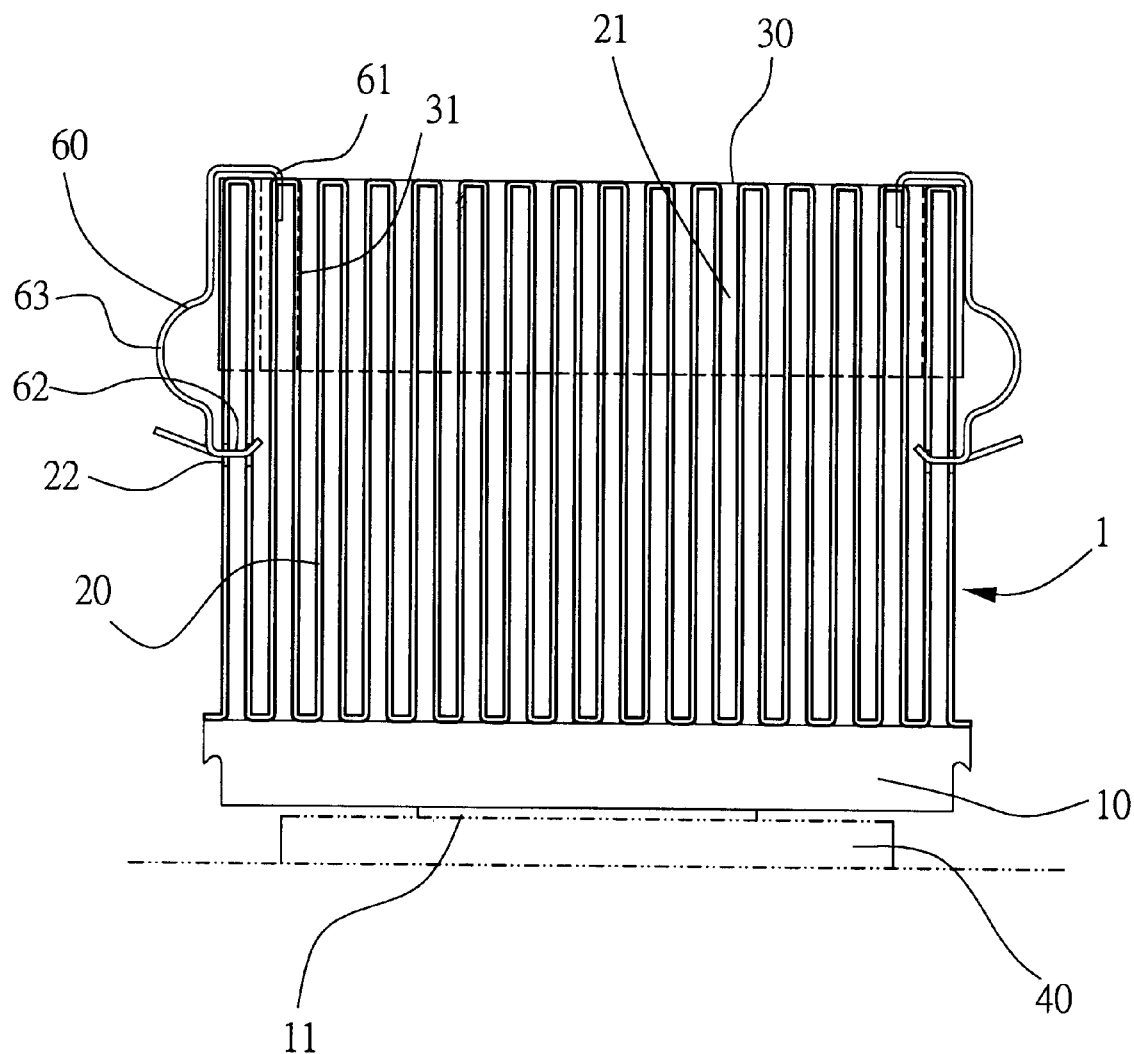
FIG. 4 is a cross-sectional view of the present invention.

Based on above description and referring to FIG. 4, the fixing part 61 of the fastener 60 is placed into the fixing hole 31 of the fan 30 first, then the hook 62 of the fastener 60 is pressed into the fastening hole 22 of the fan heat dissipating plate 20 without any tool; a elastic arm 63 is between and ties the top fixing part 61 and the bottom hook 62, the fan 30 is fixed firmly on top of the heat dissipating plate 20 by the elastic arm 63.

While a preferred embodiment of the invention has been shown and described in detail, it will be readily understood and appreciated that numerous omissions, changes and additions may be made without departing from the spirit and scope of the invention.

What is claimed is:

1. A fastening device of the CPU heat sink comprising:

a heat sink with a base contacting the top of a CPU;

a plurality numbers of heat dissipating plates on top of said base;

a hollow space formed on top of said heat dissipating plates;

a fan located in and fixed on said hollow space;

two identical fasteners with side view in 90° and in long rectangle shape fasten said fan on said hollow space;

a fixing part located on both top ends of said fasteners that corresponds to a fixing hole of said fan;

at least one hook located on bottom of said fasteners that corresponds to a fastening hole of said fan heat dissipating plate;

an elastic arm being between and tying said fixing part and said hook together.

* * * * *